(12) United States Patent
Usui et al.

(10) Patent No.: US 7,791,120 B2
(45) Date of Patent: Sep. 7, 2010

(54) CIRCUIT DEVICE AND MANUFACTURING METHOD THEREOF

(75) Inventors: Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/082,151

(22) Filed: Mar. 16, 2005

(65) Prior Publication Data

US 2005/0205976 A1 Sep. 22, 2005

(30) Foreign Application Priority Data

Mar. 17, 2004 (JP) ................ 2004-077237

(51) Int. Cl.
*H01L 27/108* (2006.01)
*H01L 29/94* (2006.01)

(52) U.S. Cl. .............. 257/296; 257/E23.178; 257/295; 257/678; 361/795

(58) Field of Classification Search ........ 257/678, 257/687, 724, E27.137, E23.178, E23.062, 257/E23.064, 679, 703, 707, 783, 295, 296, 257/751; 174/258, 255, 250, 260; 361/760, 361/782, 795, 761; 29/840; 437/183, 209
See application file for complete search history.

(56) References Cited

U.S. PATENT DOCUMENTS

| | | | | | |
|---|---|---|---|---|---|
| 4,510,554 | A | * | 4/1985 | Irikura | 361/540 |
| 4,672,152 | A | * | 6/1987 | Shinohara et al. | 174/258 |
| 5,353,498 | A | * | 10/1994 | Fillion et al. | 29/840 |
| 5,641,997 | A | * | 6/1997 | Ohta et al. | 257/788 |
| 6,021,050 | A | * | 2/2000 | Ehman et al. | 361/793 |
| 6,038,133 | A | * | 3/2000 | Nakatani et al. | 361/760 |
| 6,489,685 | B2 | * | 12/2002 | Asahi et al. | 257/774 |
| 2001/0054756 | A1 | * | 12/2001 | Horiuchi et al. | 257/678 |
| 2002/0117743 | A1 | * | 8/2002 | Nakatani et al. | 257/687 |
| 2002/0149097 | A1 | * | 10/2002 | Lee et al. | 257/686 |
| 2004/0082100 | A1 | * | 4/2004 | Tsukahara et al. | 438/106 |
| 2004/0202823 | A1 | | 10/2004 | Yoshikawa et al. | 428/174 |

FOREIGN PATENT DOCUMENTS

| | | | |
|---|---|---|---|
| JP | 02-007596 | | 1/1990 |
| JP | 08-162486 | | 6/1996 |
| JP | 2002-094247 | | 3/2002 |
| JP | 2002100726 A | * | 4/2002 |
| JP | 2004-063722 | | 2/2004 |

* cited by examiner

*Primary Examiner*—Chris Chu
(74) *Attorney, Agent, or Firm*—Fish & Richardson P.C.

(57) ABSTRACT

A manufacturing method of a circuit device that is formed by embedding a circuit in an insulating film is provided, the method including pressure bonding by a vacuum adhesion method on a first film a film that contains an insulating film between elements and is provided with a recess or a penetrated portion to adhere a second film 160 that constitutes a recess 190; embedding a pasty material of an element constituent member inside of the recess 190 by squeegeeing means such as a squeegee; and applying treatment such as drying to the material to form embedding members such as a high resistance member that becomes a resistor 180 and a high dielectric constant member 170 that constitutes a capacitor.

4 Claims, 4 Drawing Sheets

CIRCUIT DEVICE AND MANUFACTURING METHOD THEREOF

BACKGROUND OF THE INVENTION

1. Field of the Invention

The present invention relates to a circuit device and a manufacturing method thereof.

2. Description of the Related Art

With an accelerated advance in higher function portable electronics devices such as portable telephones, PDAs, DVCs and DSCs, in order that such products may be accepted by the market, smaller size and lighter weight are indispensable; accordingly, in order to realize this, highly integrated system LSIs are in demand. On the other hand, on such electronics devices, more easy-to-use and convenient ones are demanded; accordingly, on LSIs that are used in devices, higher function and higher performance are demanded. Accordingly, as an LSI chip is highly integrated, the number of I/O increases on the one hand; on the other hand a demand on miniaturization of a package itself is strong. In order to combine these, a development of a semiconductor package suitable for dense substrate mounting of semiconductor elements is strong in demand. In order to cope with such demands, a packaging technology called a CSP (Chip Size Package) is variously developed.

As an example of such a package, a BGA (Ball Grid Array) is known. The BGA is formed by mounting a semiconductor chip on a packaging substrate, followed by applying resin molding thereto, further followed by forming solder balls in area on an opposite surface as external terminals. In the BGA, a mounting area is achieved in area; accordingly, a package can be relatively easily miniaturized. Furthermore, there is no need of coping with the narrow pitch on a circuit board side and precise mounting technology becomes unnecessary; accordingly, when the BGA is used, even in the case where the package cost is a little bit higher, the mounting cost can be reduced as a whole.

FIG. 4 is a diagram showing a schematic configuration of a general BGA. A BGA 100 has a structure in which on a glass epoxy substrate 106, an LSI chip 102 is mounted through an adhesive layer 108. The LSI chip 102 is molded with a sealing resin 110. The LSI chip 102 and the glass epoxy substrate 106 are electrically connected with metal wires 104. On a back face of the glass epoxy substrate 106, solder balls 112 are arranged in array. Through the solder balls 112, the BGA 100 is mounted on a printed circuit board.

In such a package, when a semiconductor chip is sealed, for instance, transfer molding, injection molding, potting, dipping or the like is used (for instance, refer to Japanese Patent Laid-Open No. 08-162486).

Furthermore, in order to realize more precise, higher function and thinner LSIs, a technology in which on an upper portion of a base substrate, by means of a thin film technology or a thick film technology, a layer that includes a passive element that is made of a resistive element portion, a capacitor portion or a pattern wiring portion that receive power or signal supply from a base substrate side through a dielectric insulating layer is formed is disclosed (for instance, Japanese Patent Laid-Open No. 2002-94247).

However, in the existing CSPs such as disclosed in Japanese Patent Laid-Open No. 08-162486, smaller size, smaller thickness and lighter weight to an extent that is desired at present in the portable electronics devices cannot be realized. Furthermore, in an improvement in the heat dissipation properties, there is a definite limit.

Furthermore, in the technology such as disclosed in Japanese Patent Laid-Open No. 2002-94247 where a layer including a passive element made of a resistive element portion, a capacitor portion or a pattern wiring portion is formed, as a thin film or thick film formation process, a very complicated process is used; accordingly, there is a room for a further improvement in the manufacturing cost of the passive element. Still furthermore, in such a complicated process, a surface of the passive element can be flattened with difficulty; accordingly, there is a room for a further improvement in the manufacturing stability.

SUMMARY OF THE INVENTION

The present invention was achieved in view of the above-mentioned situations and intends to provide a technology that allows making a circuit device smaller and thinner.

According to the present invention, a manufacturing method of a circuit device in which a circuit element is embedded in an insulating film is provided, the manufacturing method including forming a film provided with a recess on a surface; and embedding an embedding material inside of the recess to form, inside of the recess, an embedding member that partially or wholly constitutes the circuit element.

According to the invention, an embedding member that partially or wholly constitutes a circuit element (including a passive element such as a resistor or capacitor, or an active element such as a transistor) is formed by embedding the embedding material inside of the recess; accordingly, a process of forming a circuit element becomes convenient and a surface of the circuit element can be made flat, resulting in providing miniaturized or thinned circuit devices with excellent manufacturing stability.

Furthermore, according to the invention, a manufacturing method of a circuit device in which a circuit element is embedded in an insulating film is provided, the manufacturing method including forming a film provided with a recess on a surface; and embedding an embedding material inside of the recess to form, inside of the recess, an embedding member that partially or wholly constitutes an insulating film.

According to the invention, an embedding member that partially or wholly constitutes an insulating film between elements of a circuit element is formed by embedding an embedding material inside of the recess; accordingly, a process of forming an insulating film between elements becomes convenient and a surface of the insulating film between elements can be made flat, resulting in providing miniaturized or thinned circuit devices with excellent manufacturing stability.

Furthermore, according to the invention, a circuit device formed by embedding a circuit element in an insulating film is provided, the circuit device including an insulating film between elements and at least one member that is embedded in the insulating film between elements and partially or wholly constitutes a circuit element, one surface at an upper portion of any one of the at least one member and one surface at an upper portion of the insulating film between elements forming a same plane, one surface at a lower portion of any one of the at least one member and one surface at a lower portion of the insulating film between elements forming a same plane.

According to the invention, one surface at an upper portion of any one of the at least one member and one surface at an upper portion of the insulating film between elements form a same plane, and one surface at a lower portion of any one of the at least one member and one surface at a lower portion of the insulating film between elements form a same plane;

accordingly, a top surface of a thin film that is laminated on a further upper portion forms a flat surface as well, resulting in providing miniaturized or thinned circuit devices with excellent manufacturing stability.

That one surface at an upper portion of any one of members and one surface at an upper portion of the insulating film between elements form a same plane means that one surface at an upper portion of the member and one surface at an upper portion of the insulating film between elements form a substantially same flat plane.

Furthermore, that one surface at a lower portion of any one of members and one surface at a lower portion of the insulating film between elements form a same plane means that one surface at a lower portion of the member and one surface at a lower portion of the insulating film between elements form a substantially same flat plane.

In the above, constitutions of the invention were explained; however, any combinations thereof are effective as well as embodiments according to the present invention. Furthermore, ones in which expressions of the invention are transformed into other category are also effective as embodiments of the invention.

DETAILED DESCRIPTION OF THE INVENTION

Figure 1A:
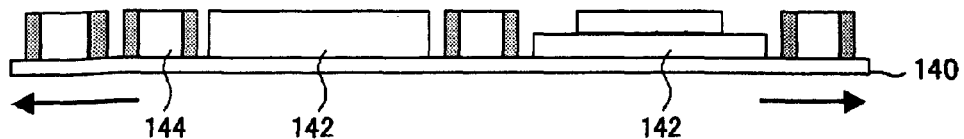
FIGS. 1A through 1E are sectional diagrams showing a first half of a manufacturing process of a circuit device in an embodiment of the present invention.

In what follows, embodiments according to the present invention will be described with reference to the drawings. In all drawings, similar constituent elements are given similar reference numerals or signs and explanations thereof will be appropriately omitted. In the present specification, an "upper direction" is a conception determined by an order when films are laminated. In seeing from a side of a film that is formed on ahead, a direction where a film that is laminated afterward is present is stipulated to be an upper direction.

FIGS. 1A through 1E are sectional diagrams showing a first half of a manufacturing process of a circuit device in the present embodiment.

Firstly, as shown in FIG. 1A, a die/chip bonding process is carried out to fix, on a substrate 140, circuit elements such as a plurality of semiconductor elements 142 and passive elements 144. Here, the substrate 140 may be a tape substrate that has the adhesiveness and can fix the semiconductor elements 142 and the passive elements 144 on a surface thereof. Furthermore, the substrate 140 can be formed of a material that can be peeled from an insulating resin film 122 after the semiconductor elements 142 and passive elements 144 are embedded in the insulating resin film 122 described later. At this time, as the substrate 140 that fixes the passive elements or the like on a surface thereof, other than a resin film, a heat conductive material such as an aluminum plate can be used.

Furthermore, in the embodiment, as the substrate 140, an expandable material can be used. As such a material, for instance, a PET film can be used. Alternatively, as the substrate 140, a UV-reactive film can be used. As the UV-reactive film, for instance, an adhesive tape that is used as a support when a semiconductor (chip) is cut and of which adhesiveness is altered by illuminating UV-light is commercially available.

The semiconductor element 142 is, for instance, a transistor, diode, IC chip and so on. Furthermore, the passive element is, for instance, a chip capacitor, chip resistor and so on. The abovementioned passive elements 144 as well can be formed by means of a technique in which an embedding material that becomes a material that partially or wholly forms the passive elements 144 is embedded inside of a recess of a film that contains an insulating film between elements to form an embedding member.

In the next place, when as the substrate 140 an expandable material is used, as shown in FIG. 1A, after the substrate 140 is expanded in a horizontal direction in the drawing, on the substrate 140, a plurality of semiconductor elements 142 and passive elements 144 are fixed.

Figure 1B:
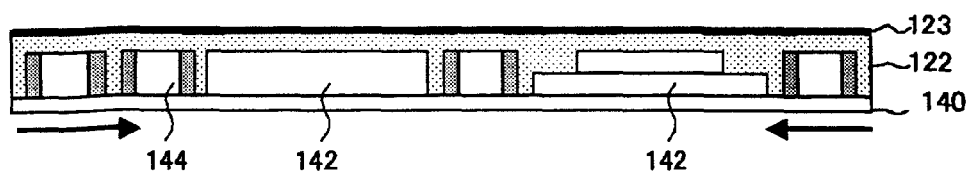

Subsequently, as shown in FIG. 1B, force that has extended the substrate 140 is removed to make gaps between chips largely smaller, followed by adhering an insulating resin film with a conductive film such as a resin film with copper foil on the substrate 140, further followed by vacuum pressing to stuff the semiconductor elements 142 and passive elements 144 in the insulating resin film 122.

Thereby, the semiconductor elements 142 and passive elements 144 are embedded inside of the insulating resin film 122, and the semiconductor elements 142 and passive elements 144 are pressure bonded and adhered to the inside of the insulating resin film 122. In the embodiment, in a state where the substrate 140 on which the semiconductor elements 142 and passive elements 144 are fixed is expanded, the semiconductor elements 142 and passive elements 144 are stuffed inside of the insulating resin film 122; accordingly, when the semiconductor elements 142 and passive elements 144 are stuffed inside of the insulating resin film 122, separations between elements become wider, resulting in enabling to readily stuff the insulating resin film 122 between elements. Accordingly, the adhesiveness between the semiconductor elements 142 and passive elements 144 and the insulating resin film 122 can be made excellent.

Furthermore, even when there are steps between the plurality of the semiconductor elements 142 and passive elements 144, the insulating resin film intrudes between the semiconductor elements 142 and passive elements 144; accordingly, a thickness from a conductive film 140 to an insulating resin film 123 can be maintained uniform. Thereby, the dimensional accuracy of a circuit device can be heightened.

The conductive film 123 is a rolled metal such as a rolled copper foil. As the insulating resin film 122, any materials that can be softened by heating can be used. For instance, an epoxy resin, melamine derivative such as a BT resin, liquid crystal polymer, PPE resin, polyimide resin, fluorocarbon resin, phenolic resin, polyamide bismaleimide and so on can be used. When such a material is used, the rigidity of the circuit device can be heightened, and thereby the circuit device is improved in the stability.

Furthermore, in the insulating resin film 122, a packing material such as filler or fibers can be contained. As the filler, for instance, particulate or fibrous $SiO_2$ and Silicon Nitride can be used. When the filler or fibers are contained in the insulating resin film 122, when, after the insulating resin film 122 is heated to thermocompression bond the semiconductor elements 142 and passive elements 144, the insulating resin film 122 is cooled to for instance room temperature, the insulating resin film 122 is less warped and the thermal conductivity also can be improved. Thereby, the adhesiveness between the semiconductor elements 142 and passive elements 144 and the insulating resin film 122 can be heightened. Still furthermore, when the fibers are contained in the insulating resin film 122, the rigidity of the insulating resin film 122 can be improved; accordingly, it can be easily handled. From these viewpoints, when aramid non-woven fabric is used as a material that constitutes the insulating resin film 122, since the fluidity of the resin becomes higher than the fiber, the machinability can be made more excellent.

As the insulating resin film with conductive film, one obtained by adhering a conductive film 123 on a film-like insulating resin film 122 can be used. Furthermore, the insulating resin film with conductive film can be formed as well by coating and drying a resin composition that constitutes the insulating resin film 122 on the conductive film 123. In the embodiment, the resin composition, in the range that does not contradict the object of the invention, may contain a hardener, hardening accelerator and other components. The insulating resin film with conductive film is placed on the substrate 140 in a state where the insulating resin film 122 is in B stage (this means a state where a resin is primary cured, half-cured or temporarily cured state).

By implementing thus, the adhesiveness between the insulating resin film 122 and the semiconductor elements 142 and passive elements 144 can be improved. Thereafter, depending on a kind of a resin that constitutes the insulating resin film 122, the insulating resin film 122 is heated to pressure bond under vacuum or reduced pressure the insulating resin film with conductive film 123 and the semiconductor elements 142 and passive elements 144. Furthermore, in another example, when a film-like insulating resin film 122, with it maintained in a B stage, is placed on a substrate 140 and further thereon a conductive film 120 is disposed to thermocompression bond the insulating resin film 122 and the semiconductor elements 142 and passive elements 144, the conductive film 123 is thermocompression bonded to the insulating resin film 122 and thereby as well an insulating resin film with conductive film 123 can be formed.

Then, the conductive film 123 is subjected to a wiring patterning process where a wiring is formed according to the laser direct drawing method (trepanning alignment) or wet copper etching.

Figure 1C:
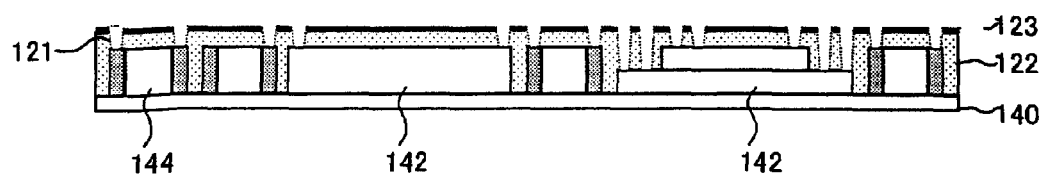

Furthermore, thereafter, as shown in FIG. 1C, a via hole (through hole) is formed in the insulating resin film 122 by use of a combination of a $CO_2$ laser, YAG laser and dry etching.

Figure 1D:
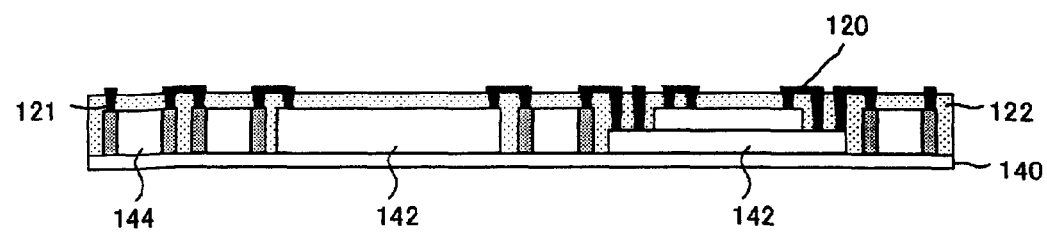

Subsequently, as shown in FIG. 1D, by use of the electroless copper plating or electrolytic copper plating compatible with high aspect ratio, a conductive film 120 is formed and a conductive material is embedded in the through hole to form a via 121. In the next place, the conductive film 120 is patterned by means of the semi-additive plating to form a high density wiring, followed by carrying out a wiring formation process in which a plurality of semiconductor elements 142 and passive elements 144 are electrically connected.

Figure 1E:
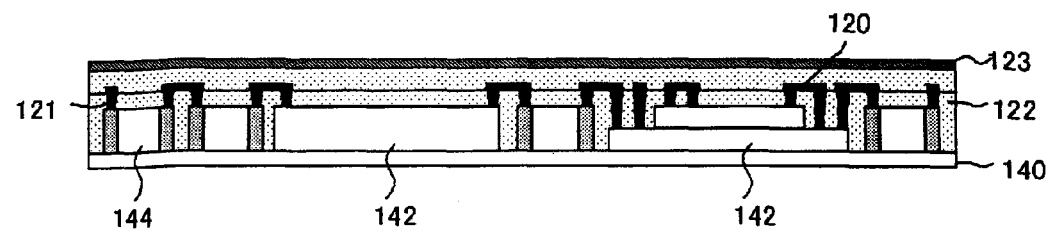

Then, as shown in FIG. 1E, so that the insulating resin film 122 of the insulating resin film with conductive film may be formed of a first insulating resin film and a second insulating resin film, a second insulating resin film formation process is carried out to further form a second insulating resin film with a conductive film 123. In the insulating resin film with conductive film, the second insulating resin film is formed on the first insulating resin film and the conductive film 123 is formed on the second insulating resin film.

In the embodiment, when the semiconductor elements 142 and passive elements 144 are embedded in the insulating resin film 122 to thermocompression bond, the second insulating resin film may be formed from a material higher in the rigidity than a material that constitutes the first insulating resin film. Thereby, at the time of the thermocompression bonding, the semiconductor elements 142 and passive elements 144 are embedded in the first insulating resin film and a shape of the insulating resin film 122 can be maintained rigidly.

A material that constitutes the second insulating resin film can be appropriately selected and used from, for instance, an epoxy resin, melamine derivative such as a BT resin, liquid crystal polymer, PPE resin, polyimide resin, fluorocarbon resin, phenolic resin, polyamide bismaleimide and so on that were explained in the first insulating resin film.

The conductive film 123 that is disposed further above the second insulating resin film may be a rolled metal such as a rolled copper foil.

Now, for instance, the first insulating resin film can be formed of a material that can be more readily softened than a material constituting the second insulating resin film. Thereby, during the thermocompression bonding, the first insulating resin film is easier to deform than the second insulating resin film; accordingly, the semiconductor elements 142 and passive elements 144 are smoothly pushed in the first insulating resin film and the second insulating resin film maintains the rigidity to inhibit the insulating resin film 122 as a whole from deforming.

Furthermore, the first insulating resin film can be formed of a material lower in the glass transition temperature than a material that constitutes the second insulating resin film. Still furthermore, in still another example, the first insulating resin film can be constituted of a material higher in the adhesiveness with the semiconductor elements 142 and passive elements 144 than with a material that constitutes the second insulating resin film. By thus implementing as well, an effect same as that mentioned above can be obtained.

Still furthermore, in the first and second insulating resin films, a packing material such as filler or fibers can be contained. In this case, a content of the packing material in the first insulating resin film can be formed so as to be smaller than that of a packing material in the second insulating resin film. Furthermore, a configuration in which the packing material is contained only in the second insulating resin film and not contained in the first insulating resin film can be adopted. By thus implementing, the flexibility of the first insulating resin film is heightened to enable to readily embed the semiconductor elements 142 and passive elements 144 and owing to the second insulating resin film the insulating resin film 122 can be reduced in warp.

As mentioned above, when the first and second insulating resin films are constituted of suitable materials depending on the respective objects, the semiconductor elements 142 and passive elements 144 can be excellently embedded in the insulating resin film 122, and thereby the rigidity of the circuit device can be heightened and the moldability can be improved.

FIGS. 2A through 2E are sectional views showing a second half of a manufacturing process of a circuit device in the embodiment of the invention.

Figure 2A:
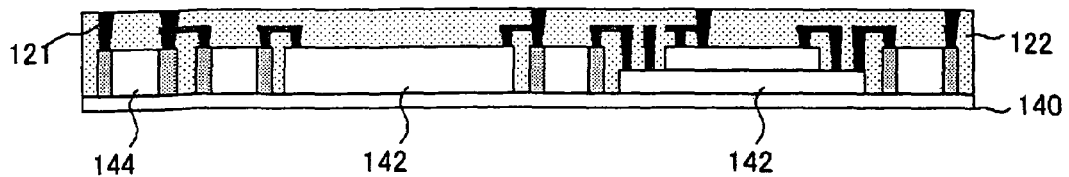
FIGS. 2A through 2E are sectional diagrams showing a second half of a manufacturing process of a circuit device in an embodiment of the invention.

Firstly, as shown in FIG. 2A, the second insulating resin film and conductive film thereabove, similarly to the above, are subjected to a wiring patterning process, via hole formation process, plating process and wiring formation process to carry out a two-layer wiring formation process.

As will be described below, when on a laminate film 160 that is laminated further above the second insulating resin film, a wiring 125 and conductive film 124 are disposed beforehand, there is no need of separately forming a wiring on a surface of the second insulating resin film.

Figure 2B:
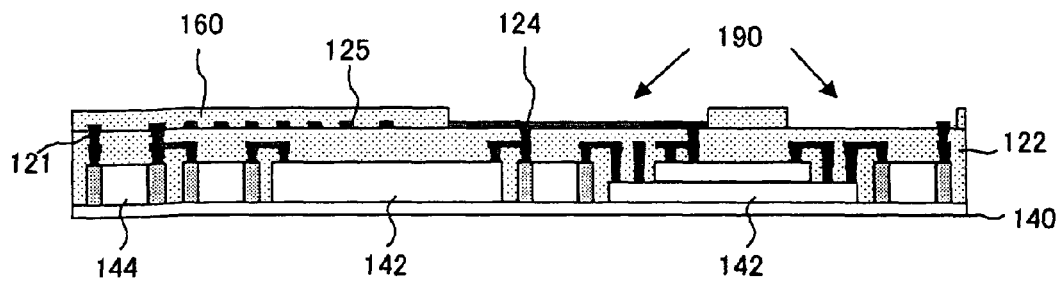

In the next place, as shown in FIG. 2B, above the second insulating resin film, a laminate film 160 that constitutes a recess 190 is laminated to perform a function layer formation first process. Since the laminate film 160 is provided beforehand with a recess indented or a portion penetrated through by means of the laser processing or press processing, when it is adhered on the second insulating resin film by the pressure bonding or the like, a recess 190 is formed. The recess 190 may be a bottomed cavity-like recess having an opening only in an upward direction of the laminate film 160 or a recess that is formed of a tunnel-like penetrated portion opened at both surfaces of the laminate film 160 and a top surface of the second insulating resin film. Anyway, there is no difference in that a pasty embedding material described later can be embedded.

When, by thus adhering owing to the pressure bonding or the like, a recess is formed by adhering a second film provided with a recess or a penetrated portion above the first film, in comparison with a case where a recess is formed by patterning or etching after a film is laminated, the recess can be formed with the manufacturing stability.

That is, in the embodiment, the recess 190 may be formed owing to the patterning or etching after a laminate film 160 is laminated on the insulating resin film 122 to form the recess 190. Alternatively, a laminate film 160 in which a recess or penetrated portion is formed beforehand may be pressure bonded on the insulating resin film 122.

Because a manufacturing process can be made more convenient, it is desirable to pressure bond a laminate film 160 provided beforehand with a recess or penetrated portion on the insulating resin film 122.

Furthermore, the laminate film 160 may be an insulating resin film. An insulating resin film that can be used in the laminate film 160 can be properly selected from, for instance, an epoxy resin, melamine derivative such as a BT resin, liquid crystal polymer, PPE resin, polyimide resin, fluorocarbon resin, phenolic resin, polyamide bismaleimide and so on that were explained in the abovementioned insulating resin film 122 and used. When such a material is used, a wiring 125 and conductive film 124 described later can be preferably insulated from other conductive members. Furthermore, such materials are easy in processing a recess or laminating owing to vacuum adhesion.

Still furthermore, the laminate film 160, not particularly restricted, from a viewpoint of the film strength, may have a film thickness of 50 nm or more, in particular, 100 nm or more. When the film thickness is in the range, even when an embedding material is embedded by use of squeegeeing means 200 in the recess 190 that the laminate film 160 constitutes, the laminate film 160 is damaged with difficulty. The film thickness of the laminate film, there being no particular upper limit, can be formed so as to be a film thickness at which the embedding member can exhibit a function as a constituting member of a circuit element.

Furthermore, in the laminate film 160, a wiring 125 and conductive film 124 may be disposed beforehand. As the wiring 125 and conductive film 124, rolled metal such as a rolled copper foil may be processed and used. By thus previously disposing the wiring 125 and conductive film 124, since separate wiring formation process and conductive film formation process become unnecessary, the manufacturing process of the circuit device can be made more convenient; accordingly, the manufacturing cost and manufacturing stability can be improved.

In the next place, a process of laminating the laminate film 160 that constitutes the recess 190 may include a process of laminating the laminate film according to a vacuum adhesion method or reduced pressure adhesion method. Here, the vacuum adhesion method or reduced pressure adhesion method means to adhere the laminate film 160 by means of the thermocompression bonding or the like under a vacuum atmosphere or reduced pressure atmosphere. Thus, when the vacuum adhesion method or reduced pressure adhesion method is used, air bubbles and so on become difficult to mingle between the second insulating resin film and the laminate film 160 or the embedding member. Accordingly, electrical contact between embedding members such as a resistor 180 and capacitor 175 and other conductive members is improved to achieve high-speed signal transmission or improve the manufacturing cost of the circuit device and the manufacturing stability.

Figure 2C:
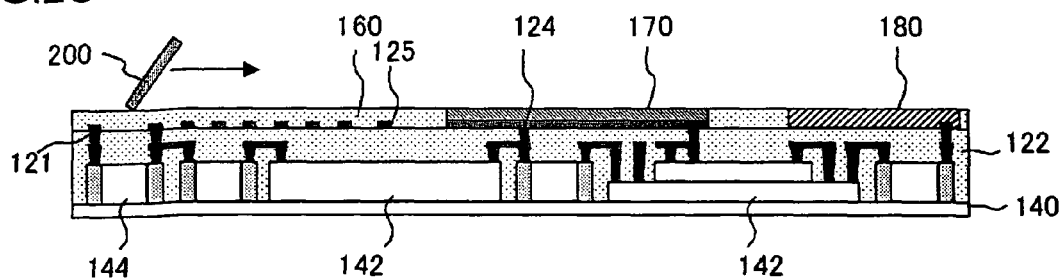

Subsequently, as shown in FIG. 2C, a functional layer formation second process including embedding a pasty embedding material in the recess 190 that the laminate film 160 constitutes; and drying the embedding material to form an embedding member that partially or wholly constitutes a circuit element such as a high dielectric constant member 170 that constitutes a resistor 180 and a capacitor 175 described later is carried out.

When thus the pasty embedding material is embedded inside of the recess 190 that the laminate film 160 constitutes to form the embedding member that constitutes partially or wholly the circuit element, a process of forming the embedding member becomes convenient and a surface of the embedding member that partially or wholly constitutes a circuit element including a high dielectric constant member 170 or the like that constitutes the resistor 180 and capacitor 175 described later can be made flat (bump-less); accordingly, miniaturized and thinned circuit devices can be produced with manufacturing stability.

Here, the embedding member that partially or wholly constitutes the circuit element can be made a member that constitutes a passive element and so on. For instance, the embedding member may be a member that partially or wholly constitutes a passive element such as a resistor 180 and a capacitor 175 described later. When the embedding member is a member that partially or wholly constitutes the resistor 180, the embedding material that is a material of the embedding member, as far as it is a material that has high resistance, is not particularly restricted, and materials including, for instance, carbon and metals such as Ni—Cr (nichrome) can be used.

Furthermore, when the embedding member is a high dielectric constant member 170 that constitutes the capacitor 175 described later, a material of the embedding member, as far as it is a material that has high dielectric constant, is not particularly restricted, for instance, materials including carbon-base materials such as activated carbon that has a large specific surface area and tantalum pentoxide can be used.

Lower and upper electrodes of the capacitor can be formed of metal having the conductivity. For instance, a thin film electrode made of copper, aluminum or the like can be used.

When a capacitor is disposed inside of the circuit device by use of an ordinary process that uses a method such as the CVD, patterning or etching, since the capacitor generally contains members made of different kinds of materials such as a high dielectric constant member and an electrode member, a top surface of the capacitor is difficult to make flat; accordingly, since a burr and so on are likely to occur and furthermore accurate etching is difficult, there is a room of improving the manufacturing stability as well.

On the other hand, like the embodiment, when the capacitor is formed by embedding a high dielectric constant material inside of a recess, since there is neither need of the lithography technique nor of applying the etching; accordingly, the manufacturing stability can be improved, accurate processing can be made easier, or the burr is suppressed from generating, resulting in diminishing the contaminations due to impurities.

Furthermore, like the embodiment, when the high dielectric constant material is embedded inside of the recess to form a capacitor, planar shapes of the lower or upper electrode of the capacitor and the high dielectric constant member are not necessary completely identical; accordingly, the alignment is easy and a design margin at the manufacture is large, resulting in improving the manufacturing stability in the point as well.

The embedding material may be a pasty material in which powdery solid is suspended in a solvent. Such a pasty material can be readily embedded inside of the recess 190 by means of squeegeeing means 200 described below.

Furthermore, the embedding process may contain an embedding process in which the embedding material is embedded by means of the squeegeeing means 200 such as a squeegee. When the squeegeeing means 200 such as the squeegee is used thus, the embedding material can be embedded inside of the recess 190 without leaving a gap and an excessive embedding material can be removed by the squeegeeing means 200; accordingly, a manufacturing process of the embedding member becomes convenient, a surface of the embedding member that partially or wholly constitutes a circuit element becomes flat, resulting in manufacturing thinned or miniaturized circuit devices with manufacturing stability.

Still furthermore, when the embedding material is embedded by use of such squeegeeing means, a gap that is likely to occur when a passive element such as a ready-made resistor or capacitor is mounted is hardly generated between a passive element and a surface where the passive element is mounted. This is because the embedding material is pressure bonded by the squeegeeing means on a mounting surface. Accordingly, in the embodiment, the characteristics of the circuit device can be inhibited from deteriorating owing to such a gap.

Alternatively, the embedding process may include a process of embedding an embedding material by means of a screen method. Here, the screen method is a kind of mimeograph method and means a printing method in which, as a plate, a screen made of a chemical fiber such as silk, Tetron or Nylon or a metal fiber is utilized.

When the screen method is applied, since a top surface of the embedding material is formed in contact with a screen surface, a surface at an upper portion of the laminate film and a surface at an upper portion of the constituent member can readily form a flat surface; as a result, since a top surface of a film laminated further thereon as well can be made flat, miniaturized or thinned circuit devices can be provided with manufacturing stability. Furthermore, in this case, unless a separate member is disposed beforehand inside of the recess, a surface at a lower portion of the laminate film and a surface at a lower portion of the constituent member can form a flat surface.

In the embodiment, as a procedure of implementing the screen method, firstly, a screen is extended on a frame, four corners thereof are stretched and tightened to fix, thereon according to a mechanical or optical engineering (photographic) method a plate film (resist) is formed, followed by clogging openings other than necessary image lines to prepare a plate. In the next place, an embedding material is charged in the frame, with squeegeeing means 200 made of a spatula-like rubber plate called squeegee, an internal surface of the screen is pressed and moved. Thereby, the embedding material goes through a portion of the screen where the plate film is not present, is pressed against the inside of the recess 190 of the laminate film 160 that is a surface of a substance to be printed and disposed below the plate to embed the inside of the recess without leaving a gap.

Furthermore, a manufacturing method of a circuit device in the embodiment may further includes removing an embedding material remaining outside of a recess 190 of the laminate film 160 by use of the squeegeeing means 200 such as a squeegee. Thus, by providing a process of removing the embedding material, the embedding material that is superfluous after the inside of the recess 190 is fully filled can be removed from on the laminate film; accordingly, a top surface of the laminate film can be flattened and the characteristics of the circuit device can be inhibited from deteriorating owing to the presence of the remaining embedding material.

As a process of removing such embedding material, a process of squeegeeing a top surface of the laminate film 160 by the squeegeeing means 200 such as a squeegee may be disposed. In this case, a process of embedding the embedding material in the recess 190 of the laminate film 160 and a process of removing the embedding material may be the same process. When the same process is adopted, the manufacturing cost and manufacturing stability of the circuit devices can be improved.

Furthermore, a process of drying the embedding material to form an embedding member such as a high dielectric constant member 170 that constitutes the resistor 180 and the capacitor 175 described later may includes a process of heating the embedding material, the laminate film 160 including the embedding material inside of the recess 190 or an entire circuit device in the middle of manufacture to dry the embedding material. Still furthermore, the process of drying the embedding material to form the embedding member may be a process same as the process where the laminate film 160 made of an insulating resin film is thermocompression bonded with other member. When the same process is adopted, the manufacturing cost and manufacturing stability of the circuit devices can be improved.

According to such a manufacturing method, a circuit device that is provided with a laminate film and an embedding member embedded in the laminate film and constituted so that one surface at an upper portion of the laminate film and one surface at an upper portion of the embedding member may form a flat surface can be provided. Furthermore, in this case, unless a separate member is beforehand formed inside of the recess, one surface at a lower portion of the laminate film and one surface at a lower portion of the embedding member can form a flat surface. Here, a flat surface that is formed from one surface at the lower or upper portion of the laminate film and one surface at the upper or lower portion of the embedding member are not necessarily a complete flat surface and may be a substantially flat surface with a little unevenness.

In the circuit device provided with such a configuration, one surface at an upper portion of the laminate film and one surface at an upper portion of the embedding member are constituted so as to form a flat surface; accordingly, a top surface of a thin film laminated further thereon as well forms a flat surface, resulting in providing thinned or miniaturized circuit devices with the manufacturing stability. Furthermore, one surface at a lower portion of the laminate film and one surface at a lower portion of the embedding member are constituted so as to form a flat surface; accordingly, the interlayer adhesiveness with a lower layer film is also improved.

Figure 2D:
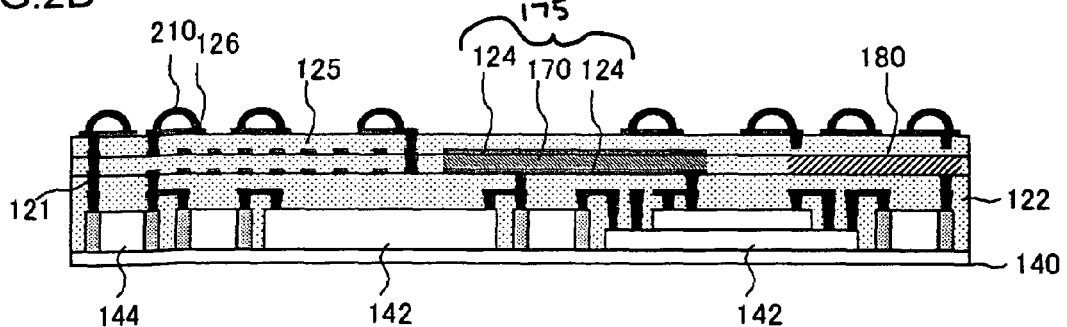

Subsequently, as shown in FIG. 2D, on a further upper portion of the laminate film and constituent members of the circuit device, a further insulating resin film and a conductive film at an upper portion thereof are formed, and, similarly to the above, a wiring patterning process, via hole formation process, plating process and wiring formation process are repeated to perform a three-layer wiring formation process. Then, on a conductive film 126 formed at an upper portion of the uppermost layer, a solder electrode formation process is applied to form solder electrodes (solder balls) 210 as a back surface electrode by a solder print method and so on.

Figure 2E:
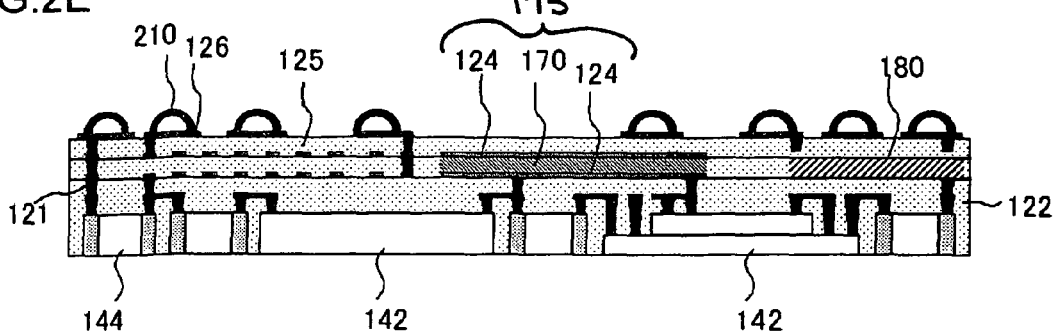

Then, as shown in FIG. 2E, a substrate peeling process is carried out to peel a substrate 140 from an insulating resin film 122. The substrate peeling process may be mechanically carried out. When the substrate 140 is a UV-reactive film, UV is irradiated to cause a cross-linking reaction in the substrate 140 to lower the adhesiveness, and thereby the substrate 140 may be removed. When the UV-reactive film is used like this, the substrate 140 can be readily removed; accordingly, the manufacturing stability of the circuit devices can be improved.

Thereby, a structure on one surface of which the semiconductor elements 142 and passive elements 144 are sealed with the insulating resin film 122 and from the other surface of which the semiconductor elements 142 and passive elements 144 are exposed can be obtained.

Thus, by exposing surfaces on a side opposite to the sealed surface of the semiconductor elements 142 and passive elements 144, even when the semiconductor elements 142 and passive elements 144 are operated and temperatures of the semiconductor elements 142 and passive elements 144 go up, heat can be allowed to escape from the exposed surfaces, resulting in providing a circuit device excellent in the heat dissipation properties. Furthermore, various methods such as disposing a heat sink on exposed surfaces of the semiconductor elements 142 and passive elements 144 or cooling the exposed surfaces can be applied.

Furthermore, since, on a surface opposite to the sealed surface of the semiconductor elements 142 and passive elements 144, a substrate and so on are not disposed, a circuit device can be miniaturized.

As will be mentioned later, in thus formed circuit device, a wiring layer can be formed by stacking another insulating resin film with conductive film on a conductive film of an insulating resin film with conductive film, followed by electrically connecting between a plurality of the semiconductor elements 142 and passive elements 144 and with other devices.

According to a manufacturing process of a circuit device in the embodiment, by use of a convenient method, a plurality of semiconductor elements 142 and passive elements 144 can be embedded and sealed in an insulating resin film 122. Furthermore, the heat dissipation properties of the circuit device can be improved. Still furthermore, the circuit device can be miniaturized.

A manufacturing method of a circuit device in the embodiment can be applied to manufacture an ISB (Integrated System in Board; registered trade mark) package. When the method is used, a manufacturing process of the ISB package can be simplified. In what follows, in order to allow understanding the embodiment, the ISB package will be explained.

The ISB is a unique coreless system in package in which in packaging an electronic circuit with a semiconductor bare chip at a center, while a wiring pattern due to copper is used, a core (substrate) for supporting a circuit element is not used. In Japanese Patent Laid-Open No. 2002-110717, such a system in package is described.

So far, an ISB package has been obtained by forming a multi-layer conductive pattern on a support substrate to form a multi-layer wiring structure, followed by further mounting circuit elements, further followed by molding with an insulating resin, still further followed by removing a conductive foil.

According to the package, advantages below can be obtained.

(i) Owing to coreless mounting, miniaturization and thinning of transistors, ICs and LSIs can be realized.

(ii) From transistors to system LSIs, and chip type capacitors and resistors form circuits, followed by packaging; accordingly, a higher degree of SiP (System in Package) can be realized.

(iii) Since it can be obtained by combining semiconductor chips in being, a system LSI can be developed in a short period.

(iv) Since a semiconductor bare chip is directly mounted on copper immediately therebelow, excellent heat dissipation properties can be obtained.

(v) Since a circuit wiring is made of copper and there is no core material, a circuit wiring low in the dielectric constant can be formed and excellent characteristics can be exhibited in high-speed data transmission and high frequency circuits.

(vi) Since electrodes are embedded inside of a package, the particle contamination owing to an electrode material can be suppressed from occurring.

(vii) A package size can be freely selected. When waste material per one package is compared with that of a 64-pin SQFP package, it is substantially one tenth; accordingly, the environmental burden can be lowered.

(viii) From a printed circuit board on which components are mounted to a printed circuit board that incorporates functions, a new conception of system configuration can be realized.

(ix) In the ISB, pattern designing can be carried out easily same as in pattern designing of a printed circuit board; accordingly, an engineer of a set maker can design by himself.

When a manufacturing method of a circuit device in the embodiment is applied in the manufacture of an ISB package, since laminating a laminate film provided with a recess, embedding a pasty embedding material inside of the recess and drying the embedding material to form a constituent member of a circuit device are provided, a circuit device provided with a resistor and a capacitor therein can be prepared.

Then, since a surface of an embedding member that partially or wholly constitutes a circuit element is flat and one surface at an upper portion of a laminate film and one surface at an upper portion of the embedding member are formed so as to form a flat surface, a surface of a film laminated further thereabove also becomes flat; accordingly, the manufacturing cost or manufacturing stability of the ISB packages can be improved, or the high-speed signal transmission can be realized. Here, a flat surface formed from one surface at an upper portion of a laminate film and one surface at an upper portion of the embedding member is not necessarily a completely flat surface and may be a substantially flat surface with a little irregularities.

Furthermore, according to the embodiment, an insulating resin film itself with which circuit elements are sealed can be functioned as a support substrate; accordingly, trouble of removing a substrate after a multi-layer wiring structure is formed can be saved. Thereby, a manufacturing process of an ISB package can be simplified and the abovementioned advantages can be obtained.

Accordingly, according to the embodiment, a multi-chip SiP that takes advantage of the wafer processing and the ISB technology and devices can be realized. Furthermore, by use of the vacuum adhesion method, on a plurality of LSIs, an insulating resin film and copper wiring can be collectively formed as well. Thereby, a bump-less structure can be realized; accordingly, high-speed signal transmission and a thinner package can be realized. As a result, a passive element can be incorporated inside of a circuit device and a thin and high-performance SiP can be provided.

In what follows, for the sake of better understanding of the embodiment, a manufacturing process of a circuit device including an existing formation process of a passive element will be described.

FIGS. 3A through 3E are sectional views showing a second half of a manufacturing process of a circuit device including an existing formation process of a passive element.

In this case as well, as a first half of a manufacturing process of a circuit device, as shown in FIGS. 1A through 1E, a process same as a first half of a manufacturing process of a circuit device in the embodiment where an embedding material is embedded in a recess by use of a squeegee can be carried out. This does not mean that the process shown in FIGS. 1A through 1E is an existing process.

Figure 3A:
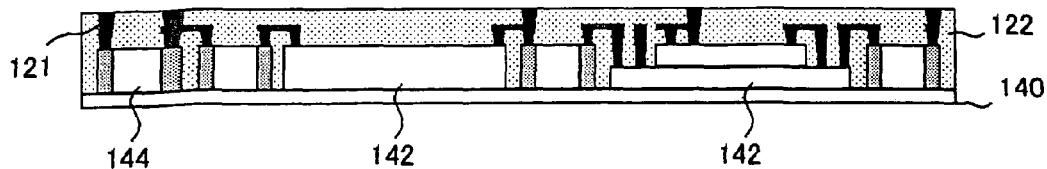
FIGS. 3A through 3E are sectional diagrams showing a second half of a manufacturing process of a circuit device including a known process of forming a passive element.

Subsequently, as shown in FIG. 3A, of a second insulating resin film and a conductive film 123 thereabove as well, similarly to the above, wiring patterning, via hole forming, plating and wiring forming are repeated to carry out a two-layer wiring process. This does not mean that a process shown in FIG. 3A is an existing process.

Figure 3B:
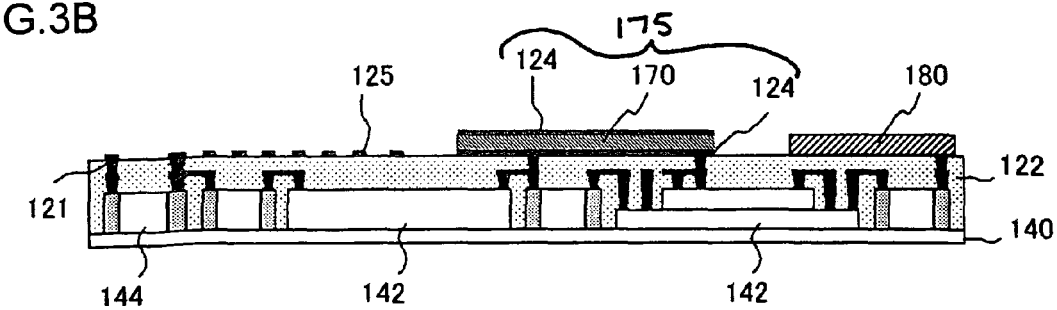

In the next place, as shown in FIG. 3B, according to an existing thin film formation method or thick film formation method, a wiring 125, a conductive film 124, a high dielectric constant material 170 and a resistor 180 are formed. As the thin film formation method or thick film formation method, an existing formation process of a passive element in which the CVD method or sputtering method, a patterning method and an etching method are combined can be used.

When an existing formation process of a passive element is used, as mentioned above, a formation process contains many steps to be complicate; accordingly, the manufacturing process of the embodiment where the embedding material is embedded in the recess by use of the squeegee is more convenient in view of the manufacturing process and more excellent in view of the manufacturing cost or manufacturing stability of the circuit device.

Figure 3C:
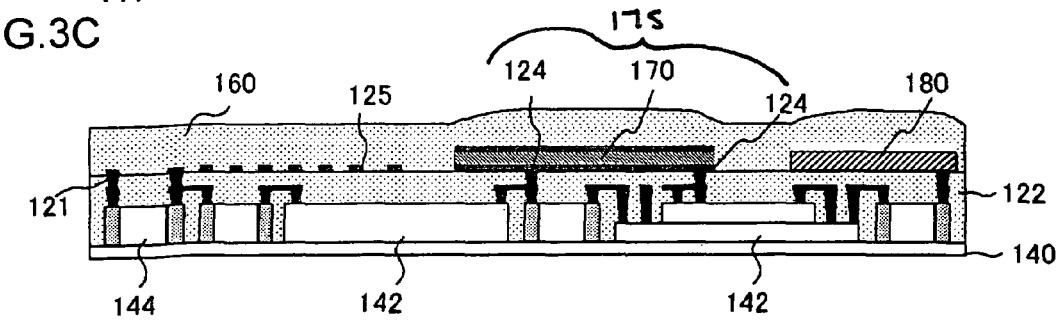

In the next place, as shown in FIG. 3C, further thereabove, according to an existing method, a laminate film 160 made of an insulating resin film and so on is formed.

In this case, since the laminate film 160 is formed on the insulating resin film 122 provided with the wiring 125, capacitor 175 and resistor 180, on a top surface of the laminate film 160, irregularities tend to be formed. Accordingly, the embodiment in which the embedding material is embedded in the recess by means of squeegeeing means such as the squeegee, since a surface of the embedding member that constitutes a part or whole of circuit elements is flat and one surface at an upper portion of the laminate film and a surface at an upper portion of the embedding member are constituted so as to form a flat surface, is superior in the manufacturing stability of the circuit device. Furthermore, when one surface at a lower portion of the laminate film and one surface at a lower portion of the embedding member are constituted so as to form a flat surface, the interlayer adhesiveness with a lower layer film becomes excellent as well.

Figure 3D:
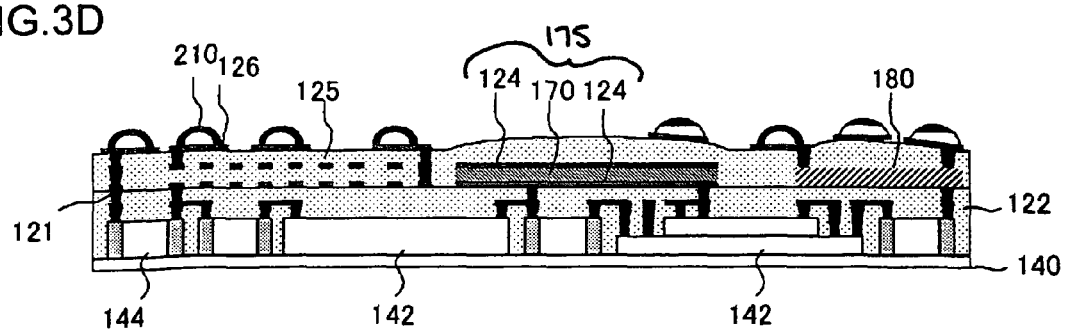
Figure 3E:
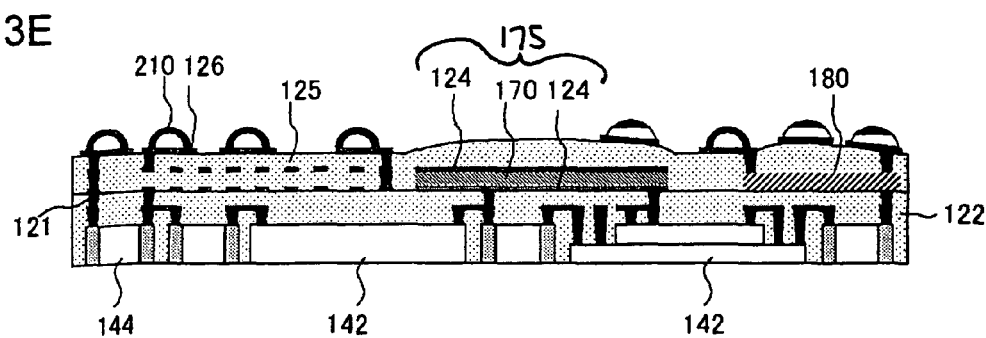
Figure 4:
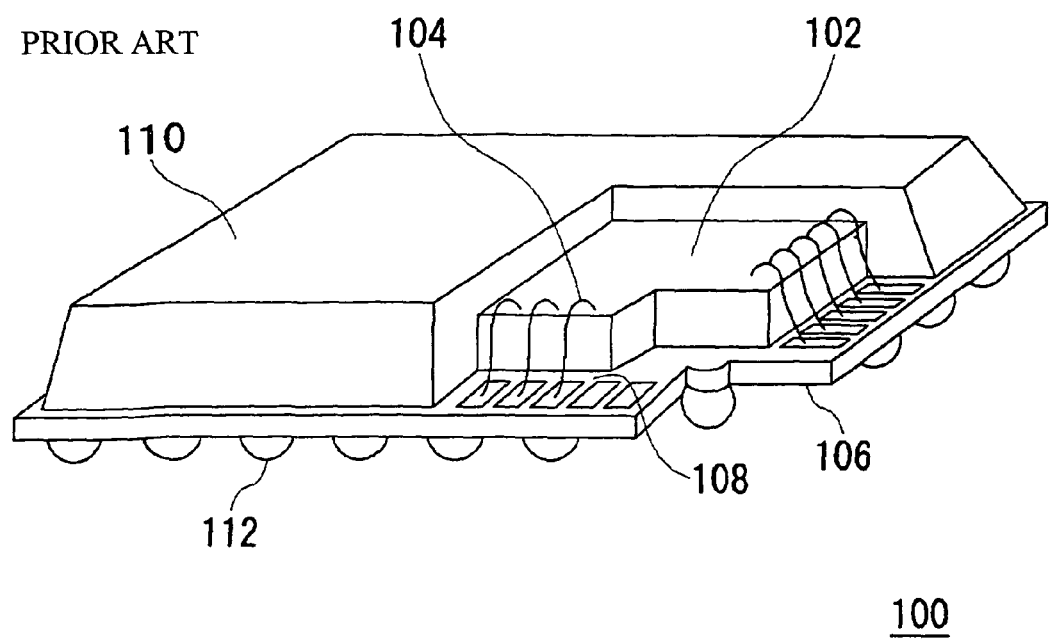
FIG. 4 is a diagram showing a schematic configuration of a general BGA.

Furthermore, as shown in FIGS. 3D and 3E, processes same as that shown in FIGS. 2E and 2E in the manufacturing process of the circuit device in the embodiment where the embedding material is embedded in the recess by use of the squeegee can be carried out. This does not mean that the processes shown in FIGS. 2D and 2E are existing processes.

In this case, irregularities formed on a surface at an upper portion of the laminate film 160 tend to be reflected on a further upper layer and a surface of the uppermost portion of the insulating resin film 122 tends to form irregularities. Furthermore, accordingly, the conductive film 126 and solder electrode 210 partially tend to incline or rise. Accordingly, in the embodiment where the embedding material is embedded in the recess by use of the squeegee, a surface of the uppermost portion of the insulating resin film 122 is flat and the conductive film 126 and solder electrode 210 do not incline or rise. As a result, when it is used as the ISB package, contact of the solder electrode 210 is excellent, resulting in an excellent ISB package.

In the above, the present invention is explained based on embodiments and examples. It is easily understood by ones skilled in the art that the embodiments and examples are only for exemplification, various modifications can be applied and such modifications are also included in the range of the invention.

For instance, as a method of embedding an embedding material inside of a recess of a film provided with a recess in a surface, without restricting to an embedding method due to a screen method, a method in which an embedding material is coated over an entire surface of the film and the embedding material present outside of the recess is removed by squeegeeing means may be used. For instance, an embedding material is deposited over an entire surface of a top surface of the film by use of the CVD method and so on and one overflowed from the recess of the embedding material may be squeegeed and removed by use of the squeegee and so on.

Alternatively, a method in which the embedding material is placed partially on a top surface of the film, and the embedding material is moved in a lateral direction past over the recess by use of the squeegeeing means to embed the embedding material inside of the recess may be used. For instance, a paste containing a carbon material is coated on a film close to the recess, the paste is moved over the film by squeegeeing the paste with a squeegee to move past a top surface of the recess, and thereby the paste may be embedded inside of the recess.

Alternatively, in a wiring layer, interlayer electrical connection, without restricting to a method where a throughhole is embedded with a conductive material, can be performed through for instance a wire. In this case, the wire may be covered with a sealing material.

A circuit element 142, as shown in FIGS. 1 through 3, may be constituted as well so as to include a circuit element in which on a first element a second element is disposed. As a combination of a second element on a first element, for instance, an SRAM and a flash memory, and an SRAM and a PRAM can be combined. In this case, the second element on the first element can be electrically connected through a via hole.

Furthermore, a material of the laminate film 160, without restricting to an insulating resin film, may be a carbon material that becomes a material of the resistor or a high dielectric constant material that becomes a constituent member of a capacitor. In this case, the embedding material that is embedded in the recess 190 of the laminate film 160 may be an insulating resin material. In the laminate film, when a region that becomes a constituent member of such a resistor and capacitor is predominant and a region that the insulating resin film occupies less, such a configuration is particularly effective.

Then, as the embedding material, without restricting to a pasty embedding material, as far as a material has the texture that allows embedding it inside of the recess of the laminate film by means of squeegeeing means, may be for instance a dried powdery material or a softened resin material.

Furthermore, as a processing method of the embedding material for forming the embedding member that partially or wholly constitutes circuit elements including capacitors and resistors, without restricting to the drying, various processing such as sintering, pressure bonding, compression, solidifying, coagulation, molding, cross-linking, curing, denaturing and so on can be used depending on the characteristics of a target embedding material.

What is claimed is:

1. A circuit device comprising:
   a plurality of first circuit elements embedded in a first insulating film, the first circuit elements having different thicknesses;
   a second insulating film above the first insulating film, wherein a thickness of the first insulating film from a surface of the first insulating film facing the second insulating film to a surface of the plurality of first circuit elements that is opposite to the surface facing the second insulating film is uniform,
   the first insulating film is provided thereon with the second insulating film, a laminate film and a member embedded in the laminate film, the member constituting a second circuit element,
   a top-most surface of the member constituting the second circuit element and a top-most surface of the laminate film form a first same plane,
   a bottom-most surface of the member constituting the second circuit element and a bottom-most surface of the laminate film form a second same plane; and
   a space extending laterally between at least two of the plurality of first circuit elements, wherein the second circuit element extends directly over an entire length of the space.

2. The circuit device according to claim 1, wherein the second circuit element is located to cover a second space above an area between the plurality of first circuit elements.

3. The circuit device according to claim 1, wherein the plurality of first circuit elements comprises at least one of a semiconductor device and a passive element.

4. The circuit device according to claim 1, wherein an entire top surface of the member constituting the second circuit element and the top-most surface of the laminate film form the first same plane, an entire bottom surface of the member constituting the second circuit element and the bottom-most surface of the laminate film form the second same plane, and the first and second same planes are flat.

* * * * *